(12) United States Patent
Kim et al.

(10) Patent No.: US 12,477,270 B2
(45) Date of Patent: Nov. 18, 2025

(54) ELECTRONIC DEVICE INCLUDING SPEAKER

(71) Applicant: SAMSUNG ELECTRONICS CO., LTD., Suwon-si (KR)

(72) Inventors: Kibum Kim, Suwon-si (KR); Jinsu Kim, Suwon-si (KR); Seokjoon Park, Suwon-si (KR); Hakjoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 294 days.

(21) Appl. No.: 18/101,271

(22) Filed: Jan. 25, 2023

(65) Prior Publication Data

US 2023/0171535 A1 Jun. 1, 2023

Related U.S. Application Data

(63) Continuation of application No. PCT/KR2022/016132, filed on Oct. 21, 2022.

(30) Foreign Application Priority Data

Oct. 26, 2021 (KR) .......................... 10-2021-0143611

(51) Int. Cl.
*H04R 1/28* (2006.01)
*H04R 1/02* (2006.01)
(Continued)

(52) U.S. Cl.
CPC ........... *H04R 1/2826* (2013.01); *H04R 1/025* (2013.01); *H04R 1/028* (2013.01); *H04R 3/00* (2013.01);
(Continued)

(58) Field of Classification Search
CPC ...... H04R 1/2826; H04R 1/025; H04R 1/028; H04R 3/00; H04R 2400/11; H04R 2499/11; H05K 9/0024
See application file for complete search history.

(56) References Cited

U.S. PATENT DOCUMENTS 9,300,344 B2    3/2016  Rayner
2005/0233781 A1* 10/2005 Erixon ................... H01Q 1/243
                                                455/575.1
(Continued)

FOREIGN PATENT DOCUMENTS

KR    20130076450 A    7/2013
KR    20160044352 A    4/2016
(Continued)

OTHER PUBLICATIONS

European Extended Search Report dated Dec. 23, 2024 for EP Application No. 22887501.9.
(Continued)

*Primary Examiner* — James K Mooney
(74) *Attorney, Agent, or Firm* — Nixon & Vanderhye P.C.

(57) ABSTRACT

The electronic device may include: a housing; a printed circuit board (PCB) disposed in the housing, the PCB including a first board surface facing a first direction and a second board surface opposite to the first board surface, and having an opening penetrating through a surface thereof, a sound module disposed in the opening so that a front thereof faces the first direction, and electrically connected to the PCB to generate a sound, a shield can connected to the second board surface to cover the opening, in a state in which the second board surface is viewed, and a frame disposed to face the first board surface.

20 Claims, 11 Drawing Sheets

(51) Int. Cl.
  *H04R 3/00* (2006.01)
  *H05K 9/00* (2006.01)
  *H04M 1/02* (2006.01)

(52) U.S. Cl.
  CPC ......... *H05K 9/0024* (2013.01); *H04M 1/0277* (2013.01); *H04R 2400/11* (2013.01); *H04R 2499/11* (2013.01)

(56) References Cited

U.S. PATENT DOCUMENTS

| | | | |
|---|---|---|---|
| 2009/0074226 A1* | 3/2009 | Eaton | H04R 11/02 |
| | | | 381/396 |
| 2012/0128196 A1* | 5/2012 | Watanabe | H04R 1/2896 |
| | | | 381/386 |
| 2016/0088398 A1 | 3/2016 | Kim et al. | |
| 2018/0116078 A1* | 4/2018 | Mun | H05K 1/111 |

FOREIGN PATENT DOCUMENTS

| | | |
|---|---|---|
| KR | 20170001240 U | 4/2017 |
| KR | 101909605 B1 | 10/2018 |
| KR | 20200085069 A | 7/2020 |
| WO | WO-2004017671 A1 * | 2/2004 ............. H04R 1/025 |

OTHER PUBLICATIONS

PCT International Search Report dated Jan. 27, 2023 for PCT/KR2022/016132.

\* cited by examiner

ELECTRONIC DEVICE INCLUDING SPEAKER

CROSS-REFERENCE TO RELATED APPLICATIONS

This application is a national stage application of International Application No. PCT/KR2022/016132 designating the United States, filed on Oct. 21, 2022, in the Korean Intellectual Property Receiving Office and claiming priority to Korean Patent Application No. 10-2021-0143611, filed on Oct. 26, 2021, in the Korean Intellectual Property Office, the disclosures of which are all hereby incorporated by reference herein in their entireties.

BACKGROUND

1. Field

An example embodiment disclosed herein relate to an electronic device including a speaker.

2. Description of Related Art

An electronic device includes a speaker for generating a sound, and the speaker may generate a sound wave through a diaphragm that vibrates according to an electrical signal. When the sound wave generated by the speaker resonates in a hermetic space, the performance of the sound emitted to the outside of the electronic device may improve.

SUMMARY

An electronic device such as a smart phone or a tablet computer may include a speaker for outputting a sound to the outside. Recently, there is a demand for electronic devices that generate high-quality sound to satisfy purchasing desires of customers. To improve the acoustic flatness and sound quality in a low-frequency region of a sound generated by a speaker, a resonance space for self-resonance of the sound generated by the speaker may be secured. Meanwhile, recent electronic devices are miniaturized to increase portability and aesthetics and require parts for performing various functions therein. Thus, techniques for securing high-quality sound while increasing the spatial utilization inside the electronic devices are developed.

An example embodiment may provide an electronic device including a speaker.

An example embodiment may form a resonance space for sound resonance through a shield can for performing a shielding function of a speaker.

An example embodiment may secure a hermetic resonance space by sealing between a shield can and a printed circuit board (PCB).

The technical goals to be achieved are not limited to those described above, and other technical goals not mentioned above are clearly understood by one of ordinary skill in the art from the following description.

According to an example embodiments, an electronic device may include: a housing; a PCB disposed in the housing, the PCB including a first board surface facing a first direction and a second board surface opposite to the first board surface, and including an opening penetrating through a surface thereof; a sound module, comprising at least one speaker, disposed at least partially in the opening so that a front thereof faces the first direction, and electrically connected, directly or indirectly, to the PCB to generate a sound; a shield can connected, directly or indirectly, to the second board surface to cover the opening, in a direction/state in which the second board surface is viewed; and a frame disposed to face the first board surface. A resonance space formed through the shield can and the PCB may be positioned at and/or proximate a rear of the sound module, and the frame may be connected, directly or indirectly, to support at least the first board surface of the PCB and a front of the sound module so that the resonance space is sealed.

According to an example embodiments, an electronic device may include: a housing having a sound hole for communicating with an outside; a frame disposed at least partially in the housing and including an acoustic duct for communicating with the sound hole; a PCB disposed at least partially in the housing, the PCB including a first board surface facing the frame and a second board surface opposite to the first board surface, and including an opening that is open to penetrate through the first board surface and/or the second board surface; a sound module, comprising at least one speaker, disposed at least partially in the opening so that a front thereof is supported by the frame; and a shield can connected, directly or indirectly, to the PCB to surround at least a rear of the sound module and form a resonance space positioned in a direction of the second board surface. The resonance space is configured to resonate acoustic vibration to be emitted to the rear of the sound module.

According to an example embodiments, an electronic device may include: a housing; a PCB disposed in the housing, the PCB including a first board surface and a second board surface opposite to the first board surface, and having an opening that is formed to penetrate through the first board surface and the second board surface; a sound module disposed in the opening so that a front thereof is exposed through the first board surface to generate a sound; a shield can connected, directly or indirectly, to the second board surface to cover the opening in a state in which the second board surface is viewed and form a hermetic resonance space positioned in a rear of the sound module; and a frame disposed to face the first board surface and connected, directly or indirectly, to the sound module to support a front of the sound module, wherein in a state in which the second board surface is viewed, the PCB may include one or more via holes that are disposed at a position overlapping the shield can and penetrate through a surface thereof.

According to an example embodiment, it is possible to form a resonance space for the resonance of a sound generated by a sound module through a shield can for shielding the sound module from the outside.

According to an example embodiment, it is possible to secure an autonomous resonance space through a shield can and a printed circuit board (PCB) without designing a separate resonance space, thereby increasing the space utilization inside an electronic device and improving the sound quality of the electronic device.

BRIEF DESCRIPTION OF THE DRAWINGS

The above and other aspects, features, and advantages of certain example embodiments of the present disclosure will be more apparent from the following detailed description, taken in conjunction with the accompanying drawings, in which.

DETAILED DESCRIPTION

Figure 1:
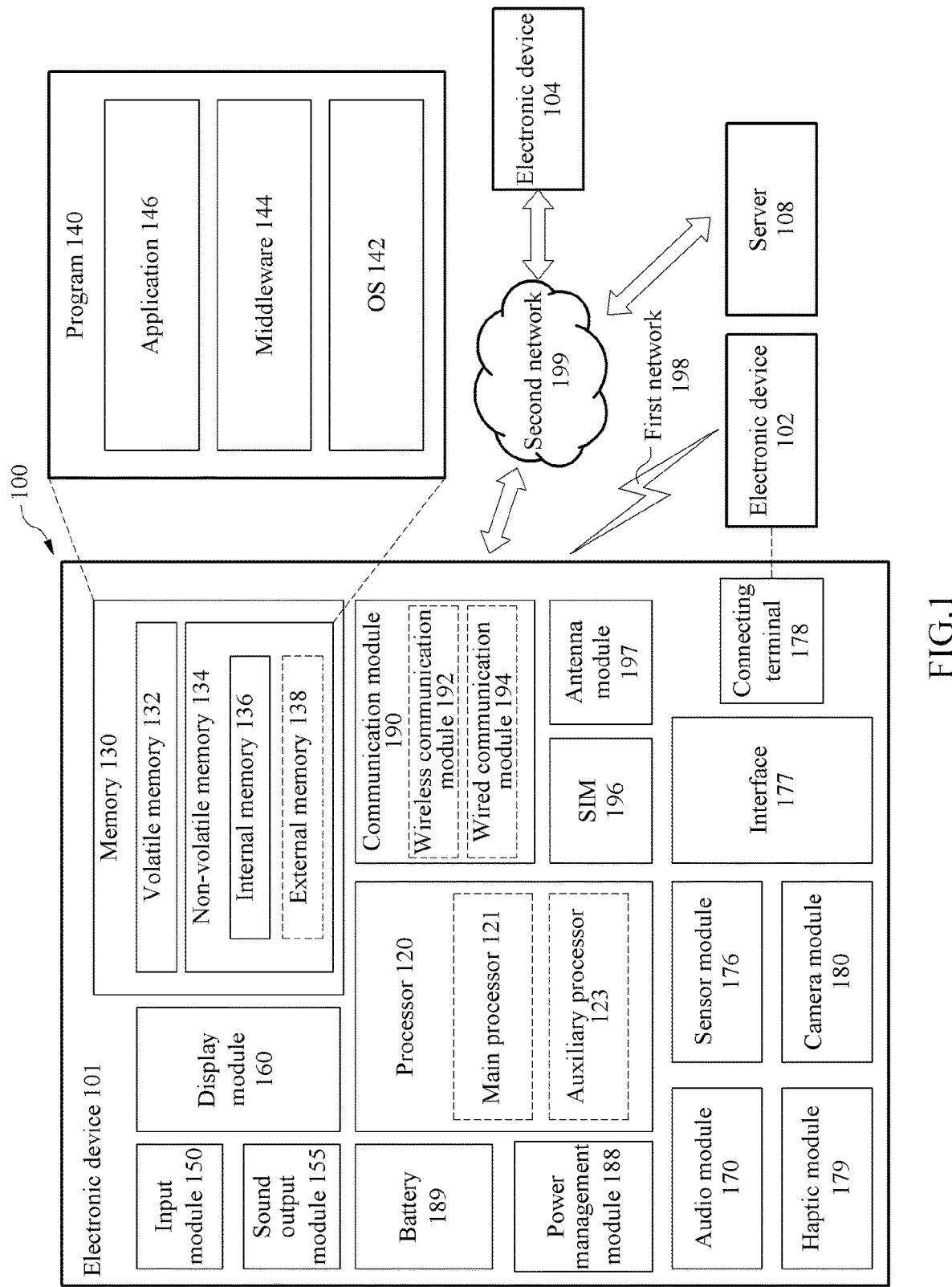
FIG. 1 is a block diagram of an electronic device in a network environment according to an example embodiment.

Hereinafter, example embodiments will be described in detail with reference to the accompanying drawings. When describing the example embodiments with reference to the accompanying drawings, like reference numerals refer to like constituent elements and a repeated description related thereto will be omitted.

FIG. 1 is a block diagram illustrating an electronic device in a network environment according to various example embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, and/or adjacent to the second surface and capable of transmitting or receiving signals in the designated high-frequency band.

At least some of the above-described components may be coupled mutually and communicate signals (e.g., commands and/or data) therebetween via an inter-peripheral communication scheme (e.g., a bus, general purpose input and output (GPIO), serial peripheral interface (SPI), or mobile industry processor interface (MIPI)).

According to an example embodiment, commands and/or data may be transmitted or received between the electronic device 101 and the external electronic device 104 via the server 108 coupled, directly or indirectly, with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, and/or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
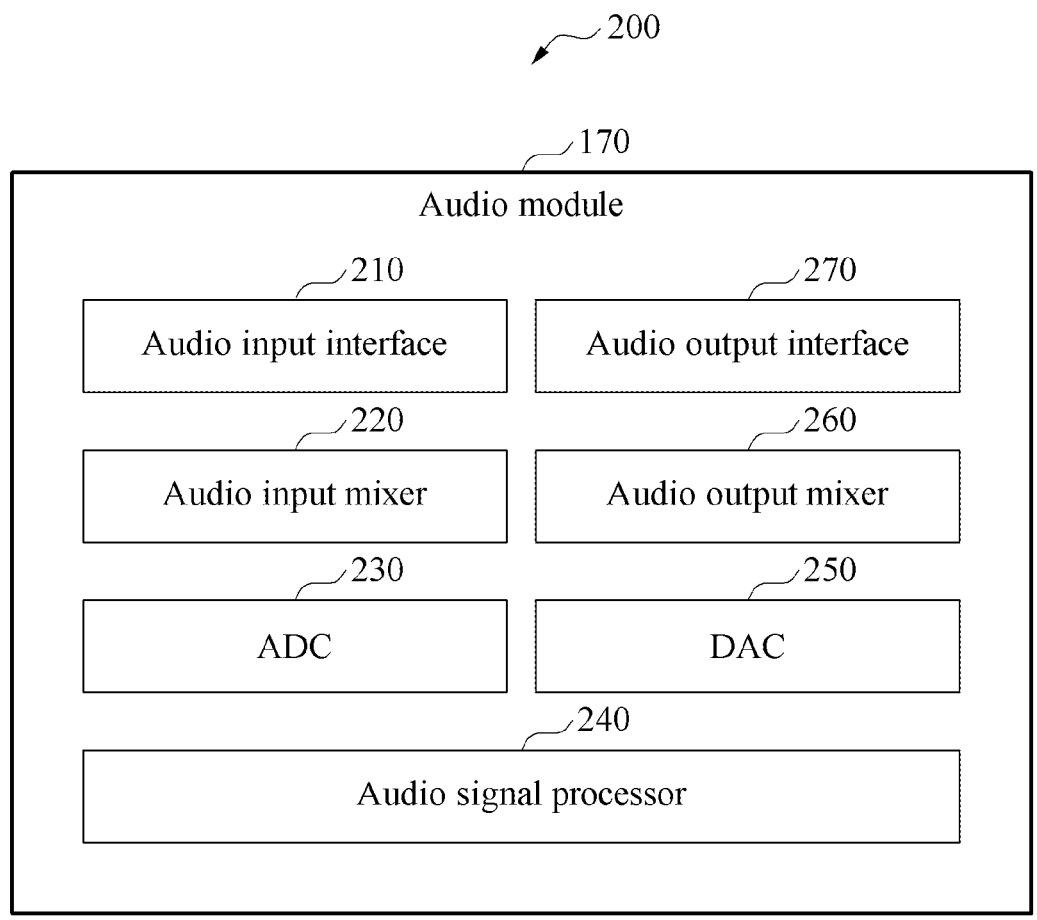
FIG. 2 is a block diagram of an audio module of an electronic device according to an example embodiment.

FIG. 2 is a block diagram 200 of an audio module 170 according to various example embodiments. Referring to FIG. 2, the audio module 170 may include, for example, an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of the electronic device 101 via a microphone (e.g., a dynamic microphone, a condenser microphone, or a piezo microphone) that is configured as part of the input module 150 or separately from the electronic device 101. For example, if an audio signal is obtained from the external electronic device 102 (e.g., a headset or a microphone), the audio input interface 210 may be connected with the external electronic device 102 directly via the connecting terminal 178, or wirelessly (e.g., Bluetooth™ communication) via the wireless communication module 192 to receive the audio signal. According to an example embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an example embodiment, additionally or alternatively, the audio input interface 210 may receive an audio signal from another component (e.g., the processor 120 or the memory 130 of FIG. 1) of the electronic device 101.

The audio input mixer 220 may synthesize a plurality of input audio signals into at least one audio signal. For example, according to an example embodiment, the audio input mixer 220 may synthesize a plurality of analog audio signals input via the audio input interface 210 into at least one analog audio signal.

The ADC 230 may convert an analog audio signal into a digital audio signal. For example, according to an example embodiment, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 101. For example, according to an example embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an example embodiment, one or more functions of the audio signal processor 240 may be implemented in the form of an equalizer.

The DAC 250 may convert a digital audio signal into an analog audio signal. For example, according to an example embodiment, the DAC 250 may convert a digital audio signal processed by the audio signal processor 240 or a digital audio signal obtained from another component (e.g., the processor 120 or the memory 130) of the electronic device 101 into an analog audio signal.

The audio output mixer 260 may synthesize a plurality of audio signals, which are to be output, into at least one audio signal. For example, according to an example embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 via the sound output module 155. The sound output module 155 may include, for example, a speaker, such as a dynamic driver or a balanced armature driver, or a receiver. According to an example embodiment, the sound output module 155 may include a plurality of speakers. In such a case, the audio output interface 270 may output audio signals having a plurality of different channels (e.g., stereo channels or 5.1 channels) via at least some of the plurality of speakers. According to an example embodiment, the audio output interface 270 may be connected with the external electronic device 102 (e.g., an external speaker or a headset) directly via the connecting terminal 178 or wirelessly via the wireless communication module 192 to output an audio signal.

According to an example embodiment, the audio module 170 may generate, without separately including the audio input mixer 220 or the audio output mixer 260, at least one digital audio signal by synthesizing a plurality of digital audio signals using at least one function of the audio signal processor 240.

According to an example embodiment, the audio module 170 may include an audio amplifier (not shown) (e.g., a speaker amplifying circuit) that is capable of amplifying an analog audio signal input via the audio input interface 210 or an audio signal that is to be output via the audio output interface 270. According to an example embodiment, the audio amplifier may be configured as a module separate from the audio module 170.

The electronic device according to various example embodiments may be one of various types of electronic devices. The electronic device may include, for example, a portable communication device (e.g., a smart phone), a computer device, a portable multimedia device, a portable medical device, a camera, a wearable device, or a home appliance device. According to an example embodiment, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "at least one of A, B, or C", each of which may include any one of the items listed together in the corresponding one of the phrases, or all possible combinations thereof. Terms such as "first", "second", or "first" or "second" may simply be used to distinguish the component from other components in question, and do not limit the components in other aspects (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via at least a third element.

As used in connection with various example embodiments of the disclosure, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 3A:
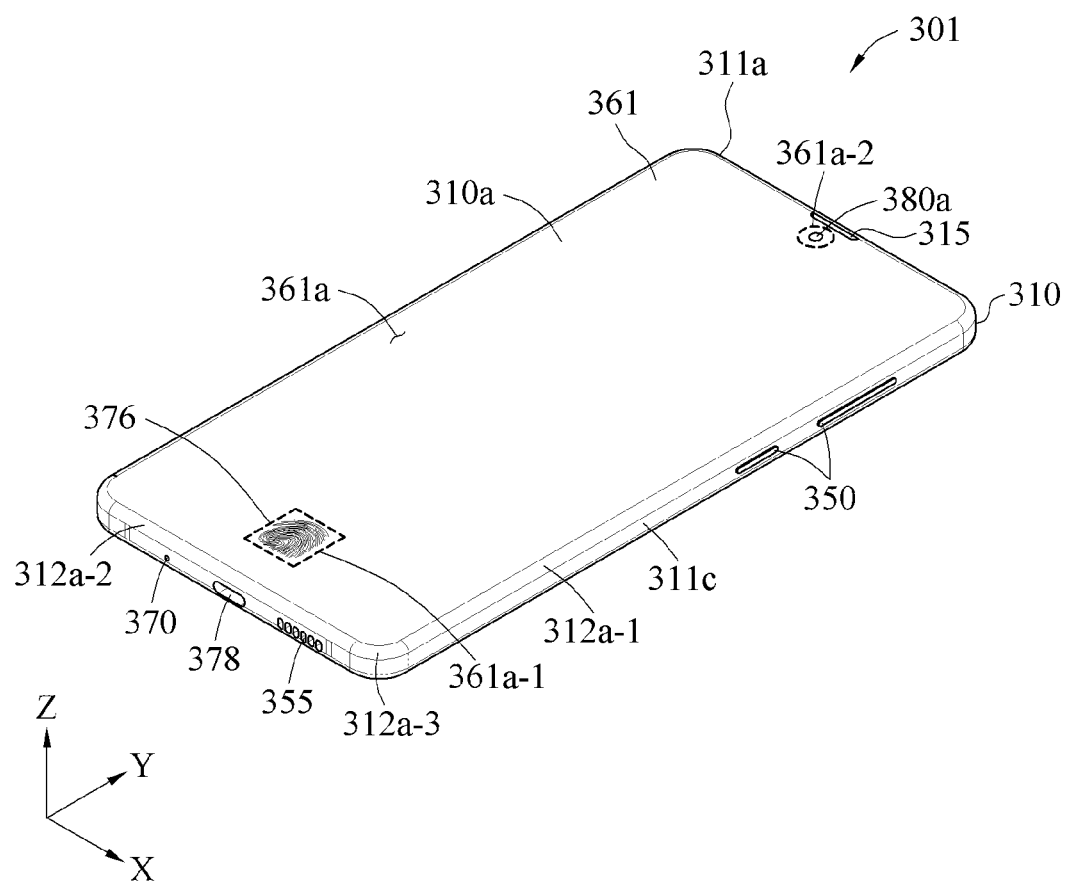
FIG. 3A is a front perspective view of an electronic device according to an example embodiment.
Figure 3B:
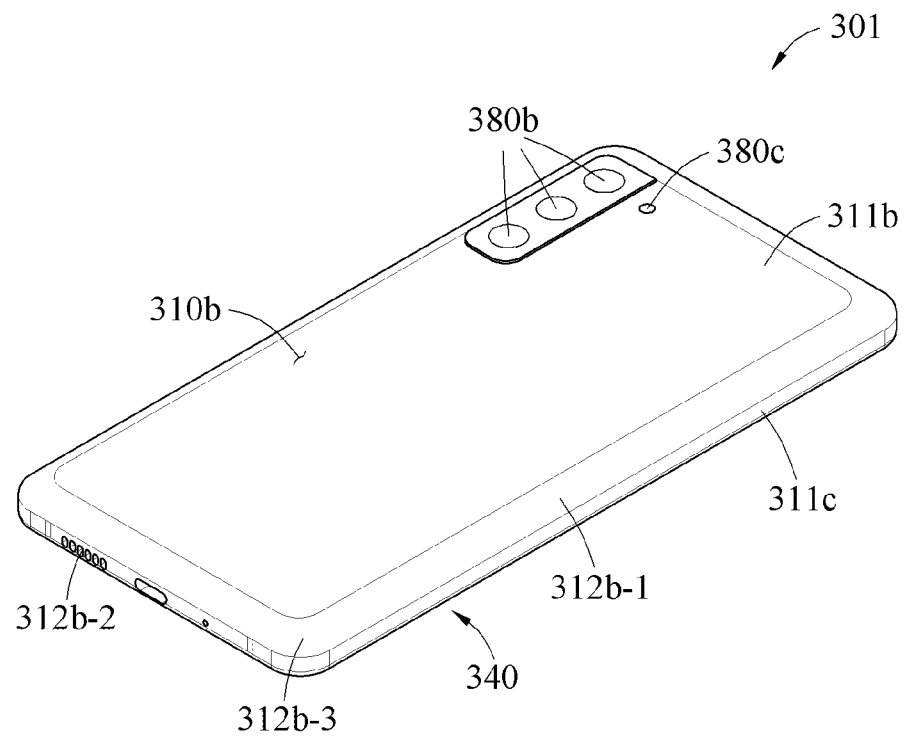
FIG. 3B is a rear perspective view of an electronic device according to an example embodiment.
Figure 4:
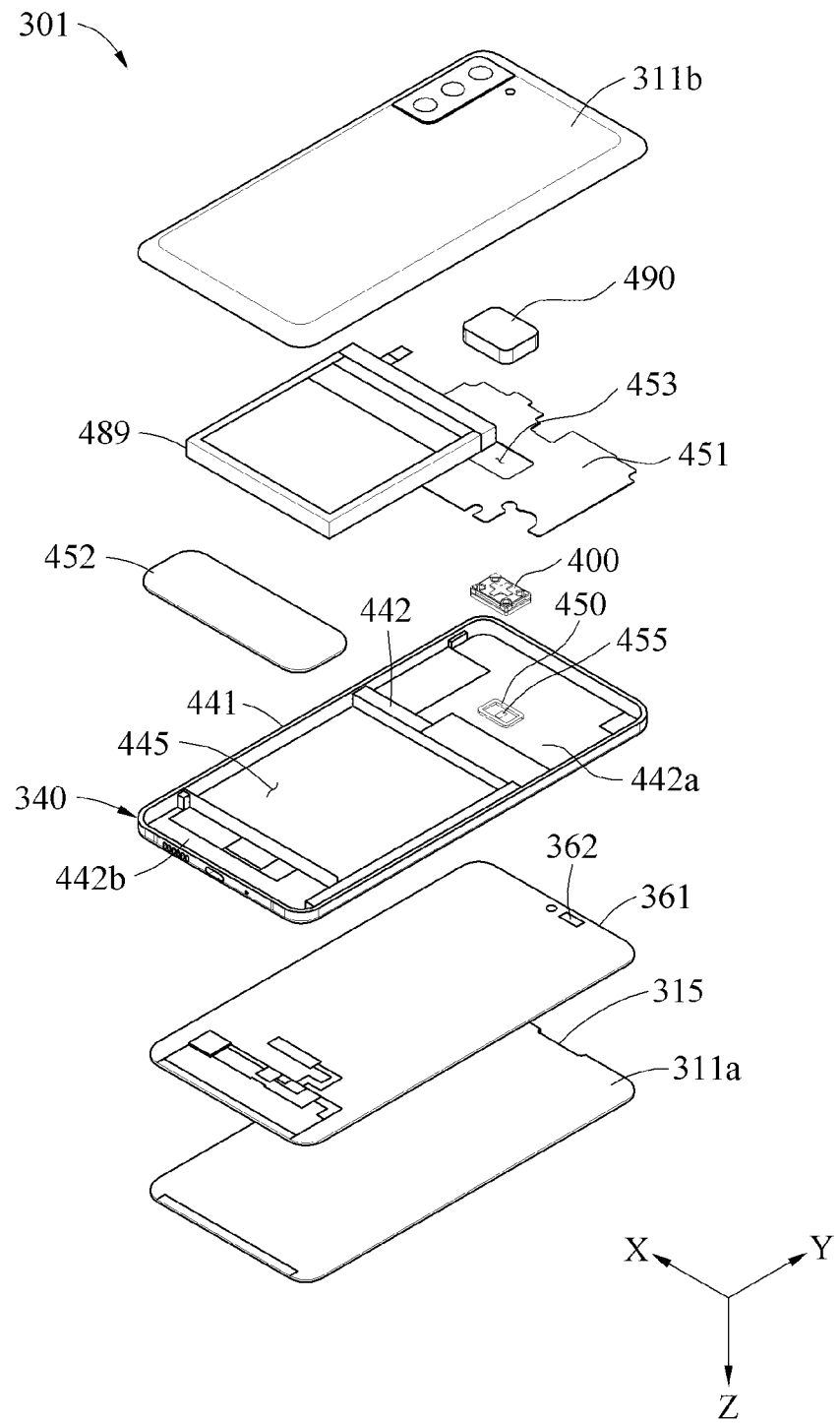
FIG. 4 is an exploded perspective view of an electronic device according to an example embodiment.

FIG. 3A is a front perspective view of an electronic device according to an example embodiment, FIG. 3B is a rear perspective view of the electronic device according to an example embodiment, and FIG. 4 is an exploded perspective view of the electronic device according to an example embodiment.

Referring to FIGS. 3A, 3B, and 4, an electronic device 301 (e.g., the electronic device 101 of FIG. 1) according to an example embodiment may include a housing 310 having a front surface 310a (e.g., the first surface), a rear surface 310b (e.g., the second surface), and a side surface 311c (e.g., the third surface) surrounding an internal space between the front surface 310a and the rear surface 310b.

In an example embodiment, the front surface 310a may be formed by a first plate 311a of which at least a portion is substantially transparent. For example, the first plate 311a may include a polymer plate or a glass plate including at least one coating layer. In an example embodiment, the rear surface 310b may be formed of a second plate 311b that is substantially opaque. For example, the second plate 311b may be formed of coated or tinted glass, ceramic, polymer, metal (e.g., aluminum, stainless steel, or magnesium), or a combination thereof. The side surface 311c may be formed by a frame 340 that is coupled, directly or indirectly, to the first plate 311a and the second plate 311b and includes a metal and/or a polymer. In an example embodiment, the second plate 311b and the frame 340 may be integrally and seamlessly formed. In an example embodiment, the second plate 311b and the frame 340 may be formed of substantially the same material (e.g., aluminum).

In an example embodiment, the first plate 311a may include a plurality of first periphery areas 312a-1 that are rounded in a direction from at least one area of the front surface 310a toward the second plate 311b and extend in one direction (e.g., a +/−X-axial direction), a plurality of second periphery areas 312a-2 that are rounded in the direction from at least one area of the front surface 310a toward the second plate 311b and extend in the other direction (e.g., a +/−Y-axial direction), and a plurality of third periphery areas 312a-3 that are rounded in the direction from at least one area of the front surface 310a toward the second plate 311b and positioned between the plurality of first periphery areas 312a-1 and the plurality of second periphery areas 312a-2.

In an example embodiment, the second plate 311b may include a plurality of fourth periphery areas 312b-1 that are rounded in a direction from at least one area of the rear surface 310b toward the first plate 311a and extend in one direction (e.g., the +/−X-axial direction), a plurality of fifth periphery areas 312b-2 that are rounded in the direction from at least one area of the rear surface 310b toward the first plate 311a and extend in the other direction (e.g., the +/−Y-axial direction), and a plurality of sixth periphery areas 312b-3 that are rounded in the direction from at least one area of the rear surface 310b toward the first plate 311a and positioned between the plurality of fourth periphery areas 312b-1 and the plurality of fifth periphery areas 312b-2.

In an example embodiment, the frame 340 may surround at least a portion of the internal space between the front surface 310a and the rear surface 310b. The frame 340 may include a first support structure 441 disposed on at least a portion of the side surface 311c and a second support structure 442 connected, directly or indirectly, to the first support structure 441 to form a space for disposing the components of the electronic device 301.

In an example embodiment, the first support structure 441 may connect the periphery of the first plate 311a and the periphery of the second plate 311b and surround the space between the first plate 311a and the second plate 311b, thereby forming the side surface 311c of the housing 310.

In an example embodiment, the second support structure 442 may be disposed inside (or in a body portion) of the electronic device 301. The second support structure 442 may be integrally formed with the first support structure 441 or may be formed separately from the first support structure 441 and connected, directly or indirectly, to the first support structure 441. In an example embodiment, PCBs 451 and 452 may be disposed on the second support structure 442. The second support structure 442 may be connected to, for example, the grounds of the PCBS 451 and 452.

In an example embodiment, a display 361 may be positioned on one surface (e.g., the lower surface (the surface in the +Z-axial direction) of FIG. 4) of the second support structure 442, and the second plate 311b may be disposed on the other surface (e.g., the upper surface (the surface in the −Z-axial direction) of FIG. 4) of the second support structure 442.

In an example embodiment, at least a portion of the frame 340 may be formed of a conductive material. For example, the first support structure 441 may be formed of a metal and/or a conductive polymer material. In an example embodiment, like the first support structure 441, the second support structure 442 may be formed of a metal and/or a conductive polymer material.

In an example embodiment, the frame 340 may include a support area 450 for receiving and/or supporting a sound module 400. Alternatively, the support area 450 may receive the sound module 400 and support the first circuit board 451. An acoustic duct 455 through which sound output from the sound module 400 is emitted may be formed in the support area 450.

In an example embodiment, the electronic device 301 may include a display 361 (e.g., the display module 160 of FIG. 1). In an example embodiment, the display 361 may be positioned on the front surface 310a. In an example embodiment, the display 361 may be exposed through at least a portion (e.g., the plurality of first periphery areas 312a-1, the plurality of second periphery areas 312a-2, and the plurality of third periphery areas 312a-3) of the first plate 311a.

In an example embodiment, the periphery of the display 361 may substantially coincide with the outer edge of the first plate 311a. In an example embodiment, the display 361 may include a touch sensing circuit, a pressure sensor for sensing an intensity (pressure) of a touch, and/or a digitizer for detecting a magnetic-type stylus pen.

In an example embodiment, the display 361 may include a screen display area 361a that is visually exposed to display content through pixels or a plurality of cells. In an example embodiment, the screen display area 361*a* may include a sensing area 361*a*-1 and/or a camera area 361*a*-2. In this case, the sensing area 361*a*-1 may overlap at least one area of the screen display area 361*a*. The sensing area 361*a*-1 may allow transmission of an input signal related to a sensor module 376 (e.g., the sensor module 176 of FIG. 1). The sensing area 361*a*-1 may display content, like the screen display area 361*a* that does not overlap the sensing area 361*a*-1. For example, the sensing area 361*a*-1 may display the content while the sensor module 376 is not operating. The camera area 361*a*-2 may overlap at least one area of the screen display area 361*a*. The camera area 361*a*-2 may allow transmission of an optical signal related to first camera modules 380*a* and 380*b* (e.g., the camera module 180 of FIG. 1). The camera area 361*a*-2 may display content, like the screen display area 361*a* that does not overlap the camera area 361*a*-2. For example, the camera area 361*a*-2 may display the content while the first camera modules 380*a* and 380*b* are not operating.

In an example embodiment, the electronic device 301 may include an audio module 370 (e.g., the audio module 170 of FIG. 1). The audio module 370 may obtain a sound from the outside of the electronic device 301. For example, the audio module 370 may be positioned on the side surface 311*c* of the housing 310. In an example embodiment, the audio module 370 may obtain a sound through at least one hole.

In an example embodiment, the electronic device 301 may include the sensor module 376. The sensor module 376 may sense a signal applied to the electronic device 301. The sensor module 376 may be positioned, for example, on the front surface 310*a* of the electronic device 301. The sensor module 376 may form the sensing area 361*a*-1 in at least a portion of the screen display area 361*a*. The sensor module 376 may receive an input signal transmitted through the sensing area 361*a*-1 and generate an electrical signal based on the received input signal. For example, the input signal may have a designated physical quantity (e.g., heat, light, temperature, sound, pressure, and/or ultrasound). As another example, the input signal may include a signal related to biometric information (e.g., a fingerprint, a voice, and the like) of a user.

In an example embodiment, the electronic device 301 may include the camera modules 380*a* and 380*b* (e.g., the camera module 180 of FIG. 1). In an example embodiment, the camera modules 380*a* and 380*b* may include a first camera module 380*a*, a second camera module 380*b*, and a flash 380*c*. In an example embodiment, the first camera module 380*a* may be disposed to be exposed through the front surface 310*a* of the housing 310, and the second camera module 380*b* and the flash 380*c* may be disposed to be exposed through the rear surface 310*b* of the housing 310. In an example embodiment, at least a portion of the first camera module 380*a* may be disposed in the housing 310 so as to be covered through the display 361. In an example embodiment, the first camera module 380*a* may receive an optical signal transmitted through the camera area 361*a*-2. In an example embodiment, the second camera module 380*b* may include a plurality of cameras (e.g., dual cameras, triple cameras, or quad cameras). In an example embodiment, the flash 380*c* may include a light-emitting diode or a xenon lamp.

In an example embodiment, the electronic device 301 may include external sound holes 315 and 355. The external sound holes 315 and 355 may output a sound to the outside of the electronic device 301, and the electronic device 301 may include the plurality of external sound holes 315 and 355.

For example, the first external sound hole 315 may be formed adjacent, directly or indirectly, to the side surface 311*c* in one direction (e.g., the +Y direction) of the housing 310 and, specifically, to the front camera module 380*a* or the camera area 361*a*-2 of the display 361. The second external sound hole 355 may be at least one hole formed on the side surface 311*c* in one direction (e.g., the −Y direction) of the housing 310. The electronic device 301 may output a three-dimensional sound to the outside of the electronic device 301 through the first external sound hole 315 and the second external sound hole 355.

In an example embodiment, an engraved area of the first external sound hole 315 may be provided on the outer edge of the first plate 311*a*, wherein the first plate 311*a* and the display 361 may be coupled, and the engraved area may be implemented as the first external sound hole 315. The display 361 may be provided with a sound hole 362 for a sound to pass therethrough, thereby guiding a sound in a direction from the sound module 400/500 to the first external sound hole 315.

According to an example embodiment, the electronic device 301 may not include the first external sound hole 315 and may directly output the sound to the outside through the sound hole 362. The display 361 according to an example embodiment may include a notch structure in which the sound hole 362 and the camera module 380*a* are positioned.

In an example embodiment, the electronic device 301 may include an input module 350 (e.g., the input module 150 of FIG. 1). The input module 350 may receive a manipulation signal of a user. The input module 350 may include, for example, at least one key input device disposed to be exposed on the side surface 311*c* of the housing 310. Each "module" herein may comprise circuitry.

In an example embodiment, the electronic device 301 may include a connecting terminal 378 (e.g., the connecting terminal 178 of FIG. 1). In an example embodiment, the connecting terminal 378 may be disposed on the side surface 311*c*. For example, when the electronic device 301 is viewed in one direction (e.g., the +Y-axial direction of FIG. 3A), the connecting terminal 378 may be positioned at a central portion of the side surface 311*c*, and a sound output module may be disposed on one side (e.g., a right side) with respect to the connecting terminal 378.

In an example embodiment, the electronic device 301 may include the PCBs 451 and 452 and a battery 489 (e.g., the battery 189 of FIG. 1). In an example embodiment, the PCBs 451 and 452 may include the first circuit board 451 and the second circuit board 452. In this case, the first circuit board 451 may be received in a first board slot 442*a* of the second support structure 442, and the second circuit board 452 may be received in a second board slot 442*b* of the second support structure 442. In an example embodiment, the battery 489 may be received in a battery slot 445 of the second support structure 442 formed between the first board slot 442*a* and the second board slot 442*b*.

In an example embodiment, the electronic device 301 may include the sound module 400 comprising at least one speaker. In an example embodiment, the sound module 400 may generate a sound. In an example embodiment, the sound module 400 may be connected, directly or indirectly, to the PCB 451 to generate a sound according to an electrical signal. For example, the PCB 451 may have an opening 453 that is partially open to pass through the surface thereof, and the sound module 400 may be disposed in the opening 453.

In an example embodiment, the opening 453 may be formed in a shape corresponding to a cross-sectional area of the sound module 400 in a plane direction (e.g., an X-Y plane), and the sound module 400 may be received in the opening 453, whereby the sound module 400 and the PCB 451 may be positioned on substantially the same plane. In an example embodiment, a shield can 490 may be connected, directly or indirectly, to the PCB 451. The shield can 490 may be connected to the PCB 451 to cover a portion of the PCB 451 in which the opening 453 is formed. When the sound module 400 is disposed in the opening 453, the sound module 400 may be covered by the shield can 490 in at least one direction. In an example embodiment, the acoustic duct 455 may be formed inside the electronic device 301 so that a sound emitted from the sound module 400 may move to the sound hole 315.

According to an example embodiment, a processor (e.g., the processor 120 of FIG. 1) may be disposed on the PCBs 451 and 452. Each processor herein comprises processing circuitry. The processor may include, for example, one or more of a central processing unit (CPU), an application processor (AP), an image signal processor, a sensor hub processor, or a communication processor. According to an example embodiment, a wireless communication circuit (e.g., the wireless communication module 192, comprising communication circuitry, of FIG. 1) may be disposed on the PCBs 451 and 452. The wireless communication circuit may perform communication with, for example, an external device (e.g., the electronic device 104 of FIG. 1). The electronic device 301 may include an antenna structure (e.g., the antenna module 197, comprising at least one antenna, of FIG. 1), and the wireless communication circuit may be electrically connected to the antenna structure. In an example embodiment, the wireless communication circuit may generate a signal to be transmitted through at least the antenna structure or detect a signal received through the antenna structure. In an example embodiment, the PCBs 451 and 452 may include grounds, and the grounds of the PCBs 451 and 452 may function as a ground of the antenna structure implemented using the wireless communication circuit.

Figure 5:
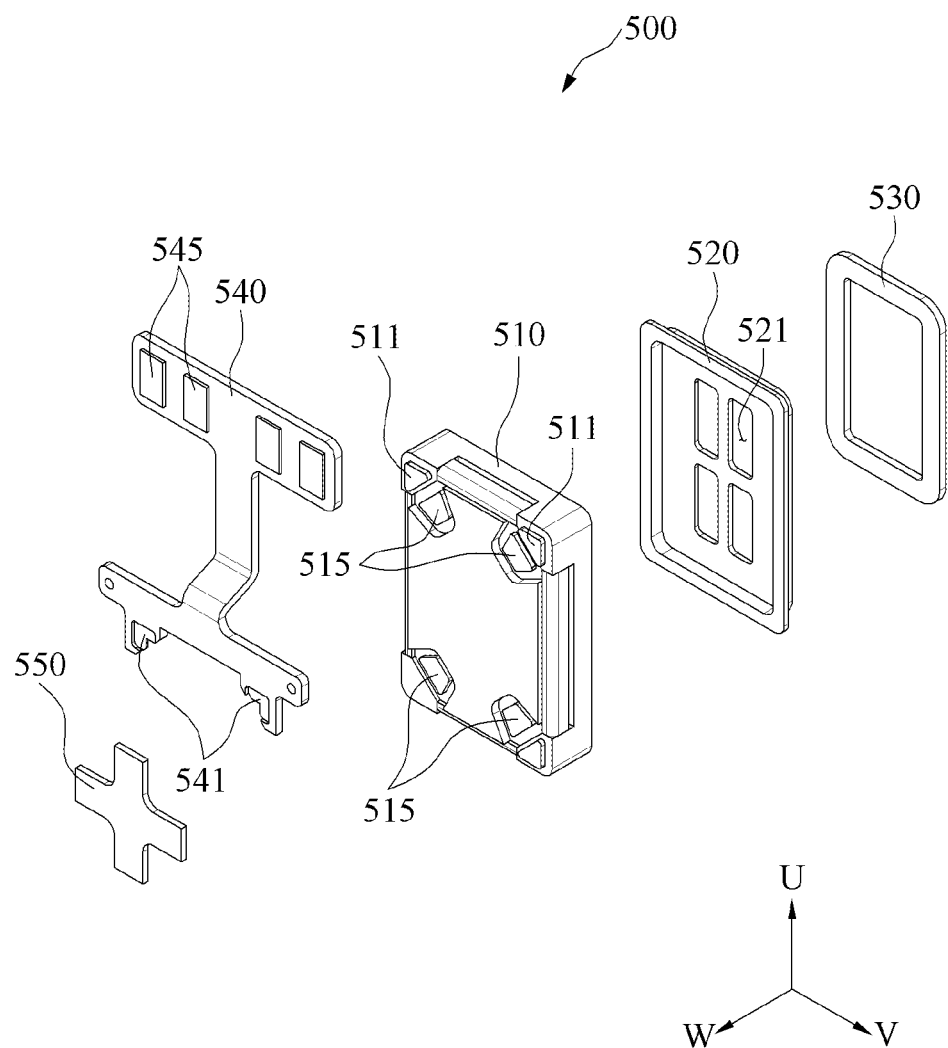
FIG. 5 is an exploded perspective view of a sound module according to an example embodiment.

FIG. 5 is an exploded perspective view of a sound module 400/500 according to an example embodiment.

A sound module 500 (e.g., the audio module 170 of FIG. 1) shown in FIG. 5 is an exemplary structure of the sound module 500, and the sound module 500 applicable to an example embodiment disclosed herein will be described. However, the sound module 500 applied to an example embodiment is not limited to the following description, and may be modified and applied in various structures and forms that can be modified by those skilled in the art.

Referring to FIG. 5, the sound module 500 according to an example embodiment may include a speaker 510, a grille 520, a terminal board 540, a first compression member 530, and a second compression member 550.

In an example embodiment, the speaker 510 may output a sound. In an example embodiment, the speaker 510 may include a diaphragm, a voice coil, a permanent magnet, and a main body. In an example embodiment, the main body may be supported by an external component, for example, an opening (e.g., the opening 453 of FIG. 4) or a frame (e.g., the frame 340 of FIG. 4), and the diaphragm may be secured and connected to the main body. In an example embodiment, the diaphragm may generate a sound corresponding to an electrical signal by vibrating by way of the voice coil and/or the permanent magnet. In an example embodiment, the speaker 510 may be formed in a substantially rectangular shape, and the diaphragm may be installed in a central portion thereof.

In an example embodiment, the speaker 510 may have the diaphragm disposed in a front direction (e.g., a direction facing the grille 520 of FIG. 5) to emit a sound, and a first terminal 511 and a plurality of vents 515 disposed in a rear direction (e.g., a direction facing the terminal board 540 of FIG. 5). In an example embodiment, the first terminal 511 may be connected to another component, for example, a PCB (e.g., the PCBs 451 and 452 of FIG. 4) to receive an electrical signal.

In an example embodiment, the plurality of vents 515 may be used to transmit the sound of the speaker 510 in a rear direction (e.g., a direction toward a +W axis). In this case, the sound generated by the speaker 510 may be transmitted to a resonance space (e.g., a resonance space 693 of FIG. 7A) formed in the rear direction and resonate in the closed resonance space. In this case, the resonance in the resonance space may improve the low-band acoustic performance of the sound emitted by the speaker.

In an example embodiment, the grille 520 may be connected, directly or indirectly, to a front (e.g., a direction toward a -W axis) of the speaker 510, and the terminal board 540 may be connected, directly or indirectly, to a rear surface of the speaker 510. In an example embodiment, the grille 520 may be used to guide the sound emitted to the diaphragm in the speaker 510 in a set direction through the opening 521 and protect the diaphragm from an external impact. In an example embodiment, the terminal board 540 may include a second terminal 541 and a third terminal 545. In this case, the second terminal 541 may be connected to the first terminal 511 of the speaker 510, and the third terminal 545 may be connected to a PCB (e.g., the PCB 451 of FIG. 4). Accordingly, the terminal board 540 may transmit power and electrical signals between the speaker 510 and the PCB. For example, the terminal board 540 may be formed as a flexible printed circuit board (FPCB).

In an example embodiment, the first compression member 530 may be connected to a front surface of the speaker 510, and the second compression member 550 may be connected to a rear surface of the speaker 510. The first compression member 530 and the second compression member 550 may be formed of an elastic material, for example, polyurethane, silicone, or rubber. In an example embodiment, when the sound module 500 is connected to another component (e.g., the frame 340 or the PCB 451 of FIG. 4), the first compression member 530 and the second compression member 550 may prevent or reduce a sound from leaking from a connecting portion between the speaker 510 and the other component. In an example embodiment, the first compression member 530 and the second compression member 550 may perform a buffering function of absorbing vibrations generated when the speaker 510 generates a sound.

Figure 6:
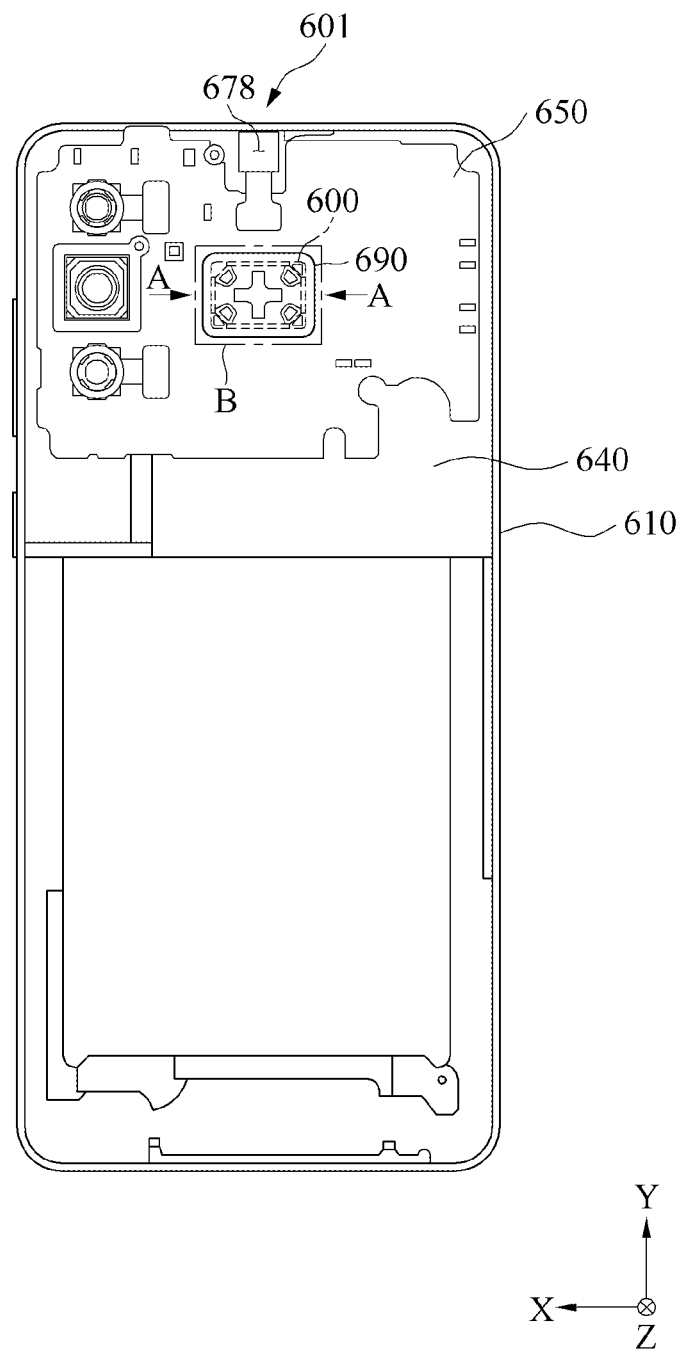
FIG. 6 is a rear view of an electronic device showing an arrangement of a sound module according to an example embodiment.
Figure 7A:
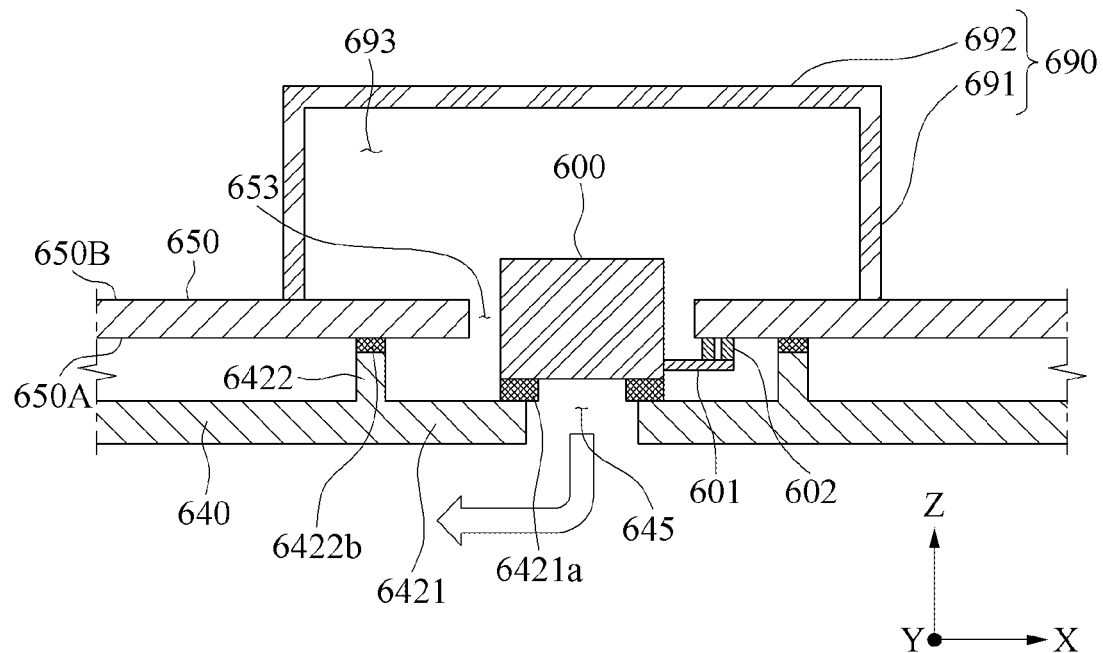
FIG. 7A is a partial cross-sectional view of the electronic device taken along a line A-A of FIG. 6.
Figure 7B:
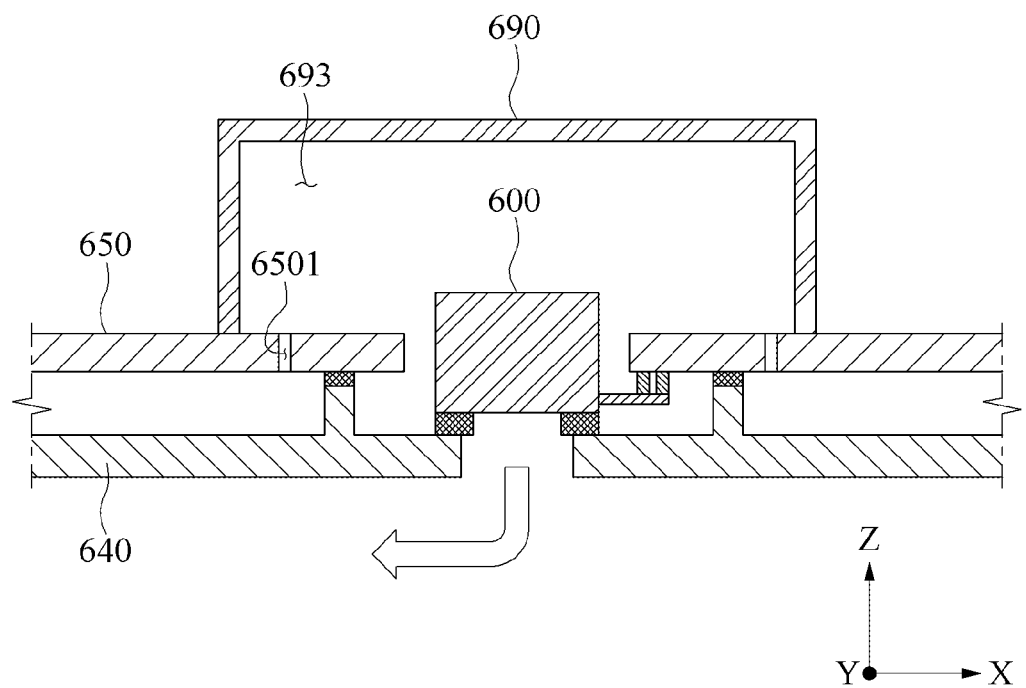
FIG. 7B is a partial cross-sectional view of the electronic device taken along the line A-A of FIG. 6.
Figure 7C:
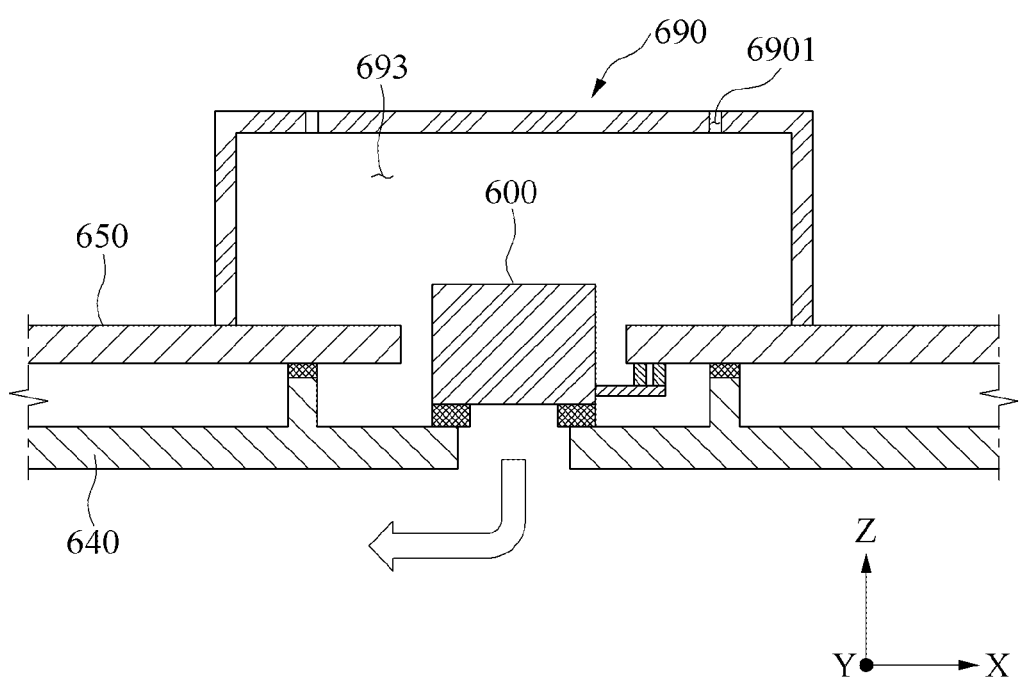
FIG. 7C is a partial cross-sectional view of the electronic device taken along the line A-A of FIG. 6.

FIG. 6 is a rear view of an electronic device showing an arrangement of a sound module according to an example embodiment, FIG. 7A is a partial cross-sectional view of the electronic device taken along a line A-A of FIG. 6, FIG. 7B is a partial cross-sectional view of the electronic device taken along the line A-A of FIG. 6, and FIG. 7C is a partial cross-sectional view of the electronic device taken along the line A-A of FIG. 6.

Referring to FIGS. 6, 7A, 7B, and 7C, an electronic device 601 (e.g., the electronic device 101 of FIG. 1, the electronic device 301 of FIG. 3A) according to an example embodiment may include a housing 610, a PCB 650, a frame 640, a sound module 600 comprising at least one speaker (e.g., see 400 and 500 above), and a shield can 690.

In an example embodiment, the housing 610 may form an exterior of the electronic device 601. The housing 640 may include one or more sound holes 678 for emitting a sound generated by the sound module 600 to an outside of the electronic device 601.

In an example embodiment, the PCB 650 may be disposed in the housing 610. The PCB 610 may be formed in the form of a plate, and various circuit elements may be mounted on, directly or indirectly, a surface thereof. In an example embodiment, the PCB 650 may include a first board surface 650A facing a first direction (e.g., −Z-axial direction) and a second board surface 650B opposite to the first board surface 650A. In this case, the PCB 650 may be disposed such that any one of the first board surface 650A and the second board surface 650B faces a rear surface (e.g., a Z-axial direction of FIG. 6) of the housing 610. Hereinafter, for ease of description, a case of the second board surface 650B facing the rear surface (e.g., the Z-axial direction of FIG. 7A) of the electronic device will be exemplarily described. In an example embodiment, the PCB 650 may include an opening 653 with a surface that is open to penetrate through the first board surface 650A and the second board surface 650B.

In an example embodiment, the sound module 600 may be electrically connected, directly or indirectly, to the PCB 650 and generate acoustic vibrations according to an electrical signal. For example, the sound module 600 may include a terminal board 6001 (e.g., the terminal board 540 of FIG. 5) electrically connected to a speaker (e.g., the speaker 510 of FIG. 5), and a connection terminal 6002 (e.g., the third terminal 545 of FIG. 5) for electrically connecting the terminal board 6001 and the PCB 650. In an example embodiment, the terminal board 6001 may be formed of an FPCB. In an example embodiment, the sound module 600 may be disposed in the opening 653 of the PCB 650. In this case, the sound module 600 may be disposed in the opening 653 such that a front of the speaker (e.g., the speaker 510 of FIG. 5) faces a first direction that the first board surface faces. Hereinafter, for ease of description, the direction that the front of the speaker faces will be referred to as the front (e.g., the −Z-axial direction of FIG. 7A) of the sound module 600, and the direction that the rear of the speaker faces will be referred to as the rear (e.g., the +Z-axial direction of FIG. 7A) of the sound module 600.

In an example embodiment, the shield can 690 may be connected to the PCB 650 to be positioned in the rear of the sound module 600. For example, in a state in which the second board surface 650B is viewed, the shield can 690 may be connected, directly or indirectly, to the second board surface 650B of the PCB 650 to cover the opening 653. In an example embodiment, the shield can 690 may include a connector 691 connected, directly or indirectly, to the second board surface 650B to form a closed loop along a perimeter of the opening 653, and a cover 692 connected, directly or indirectly, to the connector 691 to cover the resonance space 693. In a state in which the second board surface 650B is viewed, the cover 692 may overlap the opening 653.

In an example embodiment, the shield can 690 may function to shield the sound module 600 from the outside. In an example embodiment, the shield can 690 and the PCB 650 may form the resonance space 693 that surrounds the rear of the sound module 600. In an example embodiment, the resonance space 693 may function as a space for the resonance of a sound emitted to the rear of the sound module 600, thereby improving the acoustic performance in a low frequency band. According to this structure, it is possible to secure the resonance space 693 formed in the rear of the sound module 600 through the shield can 690 without forming a separate space inside the electronic device 601. Thus, the space utilization inside the electronic device 601 may improve.

In an example embodiment, the frame 640 may be disposed in the housing 610 to face the first board surface 650A of the PCB 650. In an example embodiment, the frame 640 may be disposed in the front (e.g., the −Z-axial direction of FIG. 7A) of the sound module 600 to support, directly or indirectly, the front of the sound module 600. In an example embodiment, the frame 640 may include a first support portion 6421 connected to the first board surface 650A of the PCB 650, and a second support portion 6422 connected to the front of the sound module 600. In an example embodiment, a first sealing member 6421a may be disposed at a connecting portion between the first support portion 6421 and the first board surface 650A. The first sealing member 6421a may connect the frame 640 and the first board surface 650A and seal between the frame 640 and the PCB 650. In an example embodiment, a second sealing member 6422b may be disposed at a connecting portion between the second support portion 6422 and the sound module 600. The second sealing member 6422b may connect the frame 640 and the sound module 600 and seal between the frame 640 and the sound module 600. In an example embodiment, the frame 640 may be connected to the front of the sound module 600 while being sealed through the first sealing member 6421a and connected to the first board surface 650A while being sealed through the second sealing member 6422b, thereby preventing or reducing the sound that is transmitted to the resonance space 693 from leaking in a front direction (e.g., the −Z-axial direction of FIG. 7A) of the sound module 600.

In an example embodiment, an acoustic duct 645 through which the sound emitted to the front of the sound module 600 passes may be formed in the frame 640. For example, the acoustic duct 645 may be formed through a central portion of the second support portion 6422 supporting the sound module 600. In an example embodiment, the acoustic duct 645 may communicate with the sound hole 678 formed outside the electronic device 601, thereby serving as a sound path along which the sound generated by the sound module 600 is transmitted to the outside of the electronic device through the sound hole 678.

In an example embodiment, one or more via holes 6501 may be formed in the PCB 650. The via holes 6501 may be formed through the first board surface 650A and the second board surface 650B. In an example embodiment, vias for electrically connecting respective circuit elements mounted on, directly or indirectly, the first board surface and the second board surface may be disposed in the via holes 6501. In an example embodiment, at least one of the one or more via holes 6501 may function to ventilate the resonance space. For example, at least one of the via holes 6501 formed in the PCB 650 may be formed at a position overlapping the resonance space 693 in a state in which the second board surface 650B is viewed as shown in FIG. 7B, thereby allowing the resonance space 693 to communicate with the outside. In this case, the via hole 6501 communicating with the resonance space 693 may be formed in a size enough to substantially maintain the sealed state of the resonance space 693 and to prevent or reduce an inflow of dust into the resonance space 693 from the outside. In another example embodiment, the resonance space 693 may communicate with the outside through vent holes 6901 formed through the shield can 690 as shown in FIG. 7C. According to this structure, the via holes 6501 or the vent holes 6901 may discharge air or water vapor inside the resonance space 693 to the outside according to a change in temperature or humidity. In particular, when an atmospheric pressure condition outside the electronic device 601 changes, the air pressure inside the resonance space 693 may be adjusted through the via holes 6501 or the vent holes 6901 to prevent or reduce damage to the sound module 600, for example, damage to a diaphragm of a speaker.

Figure 8A:
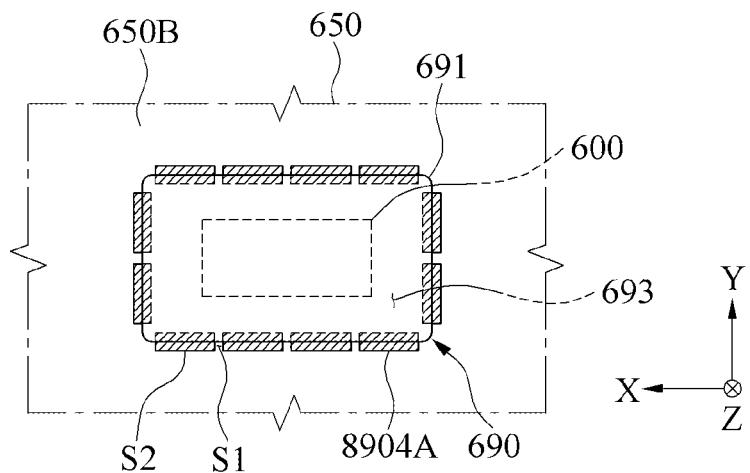
FIG. 8A is an enlarged perspective view of an area B of FIG. 6.
Figure 8B:
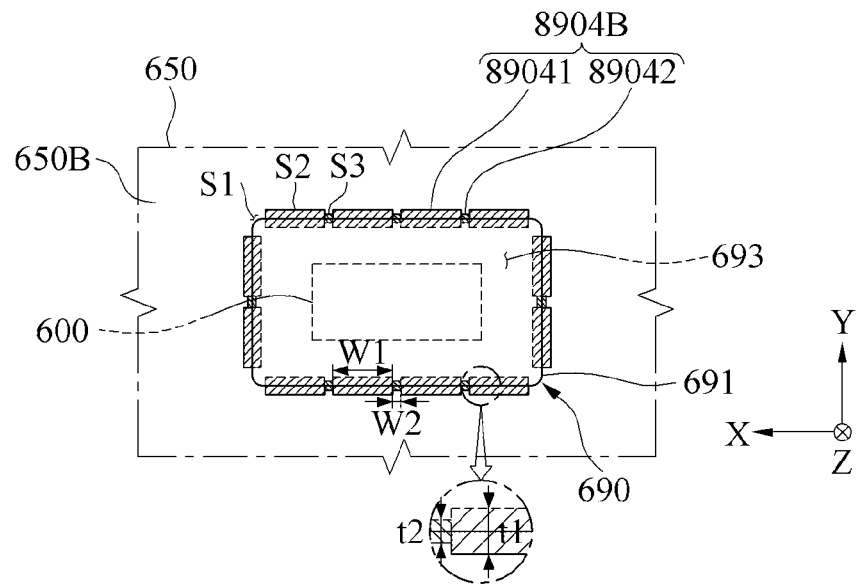
FIG. 8B is an enlarged perspective view of the area B of FIG. 6.
Figure 8C:
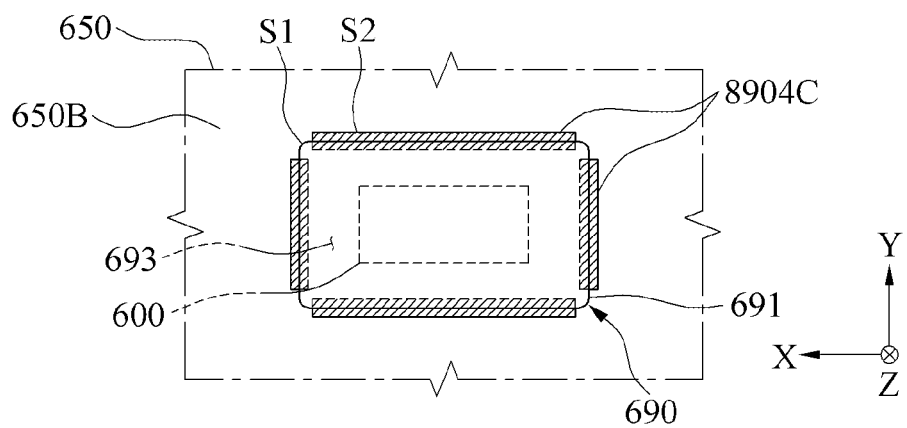
FIG. 8C is an enlarged perspective view of the area B of FIG. 6.

FIGS. 8A to 8C are enlarged perspective views of an area B of FIG. 6. FIGS. 8A to 8C respectively illustrate an example embodiment of the shield can 690 connected to the PCB 650 based on a state in which the second board surface 650B is viewed.

Referring to FIGS. 8A to 8C, the shield can 690 may be connected to the PCB 650 to surround the sound module 600 in a state in which the second board surface 650B is viewed. For example, the shield can 690 may be connected to the PCB 650 through the connector 691. In this case, the connector 691 may form a closed loop along the perimeter of the sound module 600 in a state in which the second board surface 650B is viewed. In an example embodiment, a connection pad 8904A, 8904B, 8904C may be disposed between the connector 691 of the shield can 690 and the second board surface 650B. The connection pad 8904A, 8904B, 8904C may seal a connecting portion between the connector 691 and the second board surface 650B so that the resonance space 693 may be sealed. The connection pad 8904A, 8904B, 8904C may be disposed along the closed loop formed by the connector 691 in a state in which the second board surface 650B is viewed. In an example embodiment, the connection pad 8904A, 8904B, 8904C may be provided in plurality, and the plurality of connection pads 8904A, 8904B, 8904C may be disposed at intervals along the closed loop formed by the connector 691. Meanwhile, the example embodiments shown in the drawings are provided for ease of description, and the number and arrangement position of connection pads disposed between the shield can and the PCB may be provided in various forms.

Referring to FIG. 8A, the connection pad 8904A may be disposed between the connector 691 and the second board surface 650B to connect the shield can 690 and the PCB 650. In this case, a plurality of connection pads 8904A may be disposed at intervals along the closed loop formed by the connector 691 in a state in which the second board surface 650B is viewed. In an example embodiment, the connector 691 may include a first joining portion S1 where the connection pads 8904A are not disposed and a second joining portion S2 where the connection pads 8904A are disposed, in a state in which the second board surface 650B is viewed. In an example embodiment, the connector 691 may be soldered to the second board surface 650B. In this case, the first joining portion S1 of the connector 691 may be directly soldered to the second board surface 650B. On the other hand, a solder may be omitted from the second joining portion S2, or a relatively small amount of solder may be supplied to the second joining portion S2 when compared to that supplied to the first joining portion S1. Accordingly, the entire connecting portion between the shield can 690 and the PCB 650 may be stably sealed. According to this structure, the connection pads 8904A may not be formed in a closed loop according to the cross-sectional shape of the connector 691, which makes it possible to secure convenience in the manufacturing process and prevent or reduce cracks that may occur when a solder is cut into predetermined parts during the soldering process.

Referring to FIG. 8B, the connection pad 8904B may include a plurality of portions having different thicknesses. For example, the connection pad 8904B may include a first pad portion 89041 having a first thickness t1 and a second pad portion 89042 having a second thickness t2 less than the first thickness t1, based on a state in which the second board surface 650B is viewed as shown in FIG. 8B. In an example embodiment, the connection pad 8904B may include a plurality of first pad portions 89041 and a plurality of second pad portions 89042, where a second pad portion 89042 may connect first pad portions 89041 that are adjacent to each other. In this case, a width w2 of the second pad portions 89042 may be less than a width w1 of the first pad portions 89041. In an example embodiment, the connector 691 may include a first joining portion S1 where the connection pad 8904B is not disposed, a second joining portion S2 where the first pad portions 89041 of the connection pad 8904B are disposed, and a third joining portion S3 where the second pad portions 89042 of the connection pad 8904B are disposed, in a state in which the second board surface 650B is viewed. In an example embodiment, when the connecting portion between the connector 691 and the PCB 650 is soldered, the solder supplied to the area where the connection pad 8904B is disposed may be moved to the third joining portion S3 during the soldering process. In other words, since the solder flows to the second pad portions 89042 having relatively small thickness when compared to the first pad portions 89041 during the soldering process, it is possible to prevent or reduce cracks that may occur when the solder is concentrated at a predetermined portion of the first pad portions 89041.

Referring to FIG. 8C, a plurality of connection pads 8904C may be disposed at the connecting portion between the shield can 690 and the PCB 650. In an example embodiment, the connector 691 may have a substantially polygonal shape, for example, a rectangular shape having four vertices as shown in FIG. 8C, in a state in which the second board surface 650B is viewed. In an example embodiment, the connection pads 8904C may be disposed on, directly or indirectly, portions of the connector 691 forming edges, to connect the shield can 690 and the PCB 650. In this case, joining portions S1 where the connection pads are not disposed, for example, portions of the connector 601 forming vertices in FIG. 8C, may be directly soldered to the PCB 650. According to this structure, since the connection pads 8904C are formed in the shape of straight lines rather than in the shape of a closed loop, convenience in the manufacturing process may be secured.

Each embodiment herein may be used in combination with any other embodiment(s) described herein.

Figure 9A:
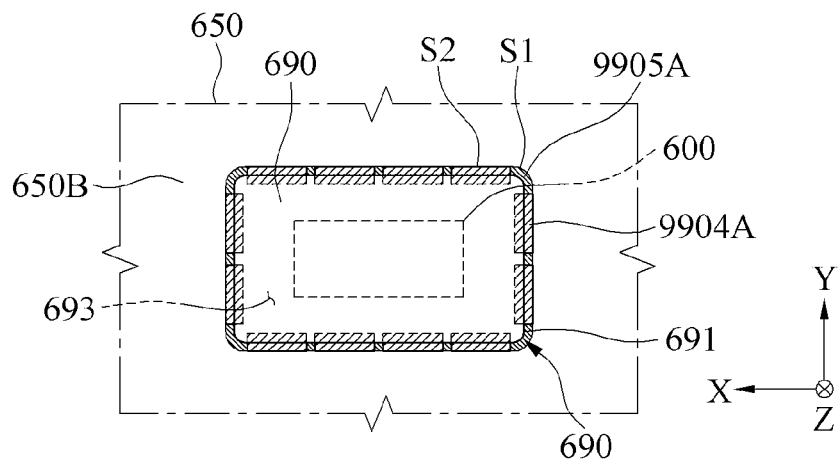
FIG. 9A is an enlarged perspective view of the area B of FIG. 6.
Figure 9B:
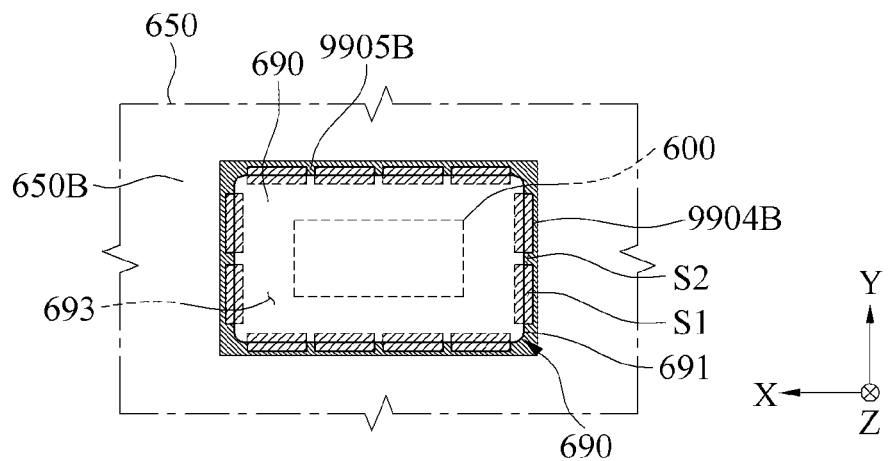
FIG. 9B is an enlarged perspective view of the area B of FIG. 6.
Figure 9C:
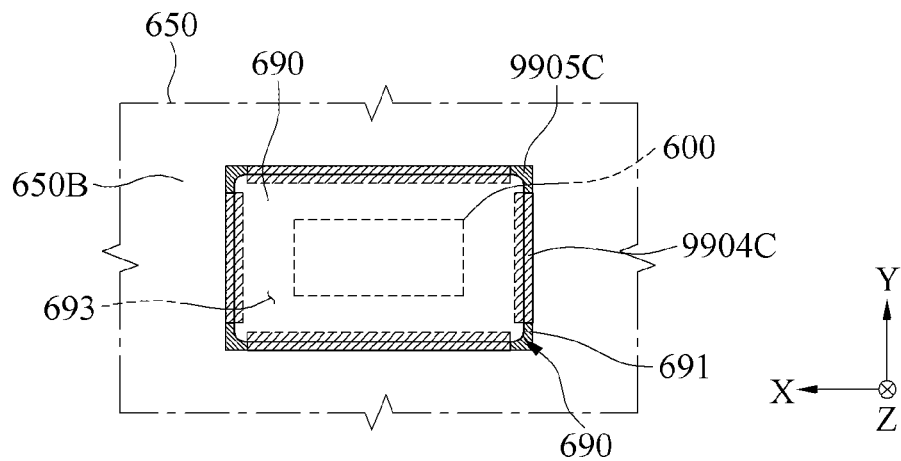
FIG. 9C is an enlarged perspective view of the area B of FIG. 6.

FIGS. 9A to 9C are enlarged perspective views of the area B of FIG. 6. FIGS. 9A to 9C respectively illustrate an example embodiment of joining members 9905A, 9905B, and 9905C disposed at the connecting portion between the PCB 650 and the shield can 690 based on a state in which the second board surface 650B is viewed.

Referring to FIGS. 9A to 9C, the joining members 9905A, 9905B, and 9905C may be applied to a joining portion between the PCB 650 and the shield can 690, thereby more stably sealing the connecting portion between the PCB 650 and the shield can 690. In an example embodiment, the joining members 9905A, 9905B, and 9905C may be formed of a resin for an adhesive, for example, a plastic material such as a phenol resin, an epoxy resin or a vinyl chloride resin, or a material in which an epoxy and a curing agent are mixed. The joining members 9905A, 9905B, and 9905C may be applied to the joining portion between the shield can 690 and the PCB 650 along the perimeter of the connector 691 that forms a closed loop, in a state in which the second board surface 650 is viewed. In an example embodiment, the joining member 9905B may be applied to the entire perimeter of the connector 691 as shown in FIG. 9B, whereas the joining member 9905A may be applied only to a partial area of the perimeter of the connector 691 as shown in FIG. 9A. For example, the joining member 9905A may be applied to an outer side of the connector along the first joining portion S1 of the connector 691 where connection pads 9904A are not disposed as shown in FIG. 9A, thereby enhancing the hermeticity of the first joining portion S1. In another example, the joining member 9905B may be disposed at the connecting portion between the shield can 690 and the PCB 650 to form a closed loop along the entire outer side of the connector 691 including the first joining portion S1 and the second joining portion S2 as shown in FIG. 9B. In still another example, when the connector 691 is formed in a polygonal shape having vertices and the connection pads 9904C are disposed at portions of the connector 691 forming edges, as shown in FIG. 9C, the joining member 9905C may be applied to the outer side of the connector 691 forming the vertices, thereby improving the hermeticity of the resonance space 693.

According to this structure, by performing the second step of sealing through the application of the joining members 9905A, 9905B, and 9905C in addition to the first step of sealing between the shield can 690 and the PCB 650 through the connection pads 9904A and 9904C and soldering, the connecting portion between the PCB 650 and the shield can 690 may be more firmly sealed. Accordingly, it is possible to prevent or reduce a sound introduced into the resonance space 693 from leaking.

According to an example embodiment, an electronic device may include: a housing; a PCB disposed in the housing, the PCB including a first board surface facing a first direction and a second board surface opposite to the first board surface, and having an opening penetrating through a surface thereof; a sound module, including a speaker, disposed in the opening so that a front thereof faces the first direction, and the sound module electrically connected to the PCB and configured to generate a sound; a shield can connected to the second board surface to cover the opening; and a frame disposed to face the first board surface. A resonance space, formed at least through the shield can and the PCB may be positioned at least at a rear of the sound module. The frame may be connected to support, directly or indirectly, at least the first board surface of the PCB and a front of the sound module so that the resonance space is sealed.

In an example embodiment, the shield can 690 may be connected to the PCB 650 at least through a connector 691 forming a closed loop along a perimeter of the opening 653, and a plurality of connection pads 8904A for sealing may be disposed between at least the connector 691 and the PCB 650.

In an example embodiment, the plurality of connection pad 8904A may be integrally connected along the connector 691 to form a closed loop.

In an example embodiment, based on a direction/state in which the second board surface 650B is to be viewed, the connection pad 8904B may include first pad portions 89041 having a first thickness t1, and a second pad portion 89042 disposed between at least the first pad portions 89041 and having a second thickness t2 less than the first thickness t1.

In an example embodiment, a portion of the connector 691 where the second pad portion 89042 is disposed may be soldered to the PCB 650.

In an example embodiment, the connector 691 may include a first joining portion S1 where the connection pad 8904A is not disposed and a second joining portion S2 where the connection pad 8904A is disposed, and the first joining portion S1 may be soldered to the PCB 650.

In an example embodiment, the electronic device may further include: a joining member 9905A provided at an outer side of the connector 691 to seal a connecting portion between the shield can 690 and the PCB 650.

In an example embodiment, the joining member 9905A may be applied to the outer side of the connector 691 corresponding to the first joining portion S1.

In an example embodiment, the connector 691 may be formed in a substantially polygonal shape having vertices, and the joining member 9905C may be applied to the outer side of the connector 691 corresponding to the vertices.

In an example embodiment, a sound hole 678 for emitting the sound to an outside may be formed in the housing 610, and the frame 640 may include an acoustic duct 655 for communicating with the sound hole 678 and for allowing the sound to be emitted to the front of the sound module 600 to move through.

In an example embodiment, the frame 640 may include a first support portion 6421 connected to at least the first board surface 650A, and a first sealing member 6421a for sealing between the frame 640 and the PCB 650 may be disposed on, directly or indirectly, the first support portion 6421.

In an example embodiment, the first support portion 6421 may be connected to the PCB 650 to surround a perimeter of the sound module 600.

In an example embodiment, the frame 640 may include a second support portion 6422 connected to the sound module 600, and a second sealing member 6422b for sealing between the frame 640 and the sound module 600 may be disposed on, directly or indirectly, the second support portion 6422.

In an example embodiment, the PCB 650 may include one or more via holes 6501 penetrating through the first board surface 650A and the second board surface 650B, and at least one of the one or more via holes 6501 may be formed at a position overlapping the resonance space 693.

In an example embodiment, the shield can 690 may include one or more vent holes 6901 for ventilating the resonance space 693.

According to an example embodiment, an electronic device 601 may include: a housing 610 including a sound hole 678 for communicating with an outside; a frame 640 disposed at least partially in the housing 610 and including an acoustic duct 655 for communicating with the sound hole 678; a PCB 650 disposed at least partially in the housing 610, the PCB 650 including a first board surface 650A facing the frame 640 and a second board surface 650B opposite to the first board surface 650A, and including an opening 653 that is open to penetrate through the first board surface 650A and the second board surface 650B; a sound module 600, including a speaker, disposed at least partially in the opening 653 so that a front thereof is supported by at least the frame 640; and a shield can 690 connected to the PCB 650 to at least partially surround a rear of the sound module 600 and form a resonance space 693 positioned in a direction of the second board surface 650B. The resonance space 693 may resonate acoustic vibration emitted to the rear of the sound module 600.

In an example embodiment, the shield can 690 may include a connector 691 soldered to the second board surface 650B, and a connection pad(s) 8904A for sealing between the shield can 690 and the PCB 650 may be disposed on, directly or indirectly, the connector 691.

In an example embodiment, the connector 691 may include a first joining portion S1 where the connection pad 8904A is not disposed and a second joining portion S2 where the connection pad 8904A is disposed.

In an example embodiment, the electronic device 601 may further include: a joining member 9905A applied to an outer side of the connector 691 for sealing between the shield can 690 and the PCB 650.

According to an example embodiment, an electronic device 601 may include: a housing 610; a PCB 650 disposed in the housing 610, the PCB 650 including a first board surface 650A and a second board surface 650B opposite to the first board surface 650A, and including an opening 653 that is formed to penetrate through the first board surface 650A and the second board surface 650B; a sound module 600, comprising at least one speaker, disposed at least partially in the opening 653 so that a front thereof is exposed through the first board surface 650A to generate a sound; a shield can 690 connected to the second board surface 650B to cover the opening and form a hermetic resonance space 693 positioned proximate a rear of the sound module 600; and a frame 640 disposed to face the first board surface 650A and connected to the sound module 600 to support, directly or indirectly, a front of the sound module 600. The PCB 650 may include at least one via holes 6901 that are disposed at a position overlapping the shield can 690 and penetrating through a surface thereof.

What is claimed is:

1. An electronic device, comprising:
    a housing;
    a printed circuit board (PCB) disposed in the housing, the PCB comprising a first board surface facing a first direction and a second board surface opposite to the first board surface, and comprising an opening penetrating through the first board surface and the second board surface;
    a sound module, comprising a speaker, disposed at least partially in the opening so that a front thereof faces the first direction, the sound module electrically connected to the PCB and configured to generate a sound;
    a shield can connected to the second board surface to cover the opening and a rear of the sound module; and
    a frame disposed to face the first board surface,
    wherein a resonance space, formed between at least the shield can and the PCB, is positioned at least at the rear of the sound module, and
    wherein the frame is connected to support at least the first board surface of the PCB and the front of the sound module so that the resonance space is sealed.
2. The electronic device of claim 1, wherein
    the shield can is connected to the PCB through at least a connector forming a closed loop along a perimeter of the opening, and
    a plurality of connection pads for sealing is disposed between at least the connector and the PCB.
3. The electronic device of claim 2, wherein
    the plurality of connection pads is integrally connected along the connector to form the closed loop.
4. The electronic device of claim 2, wherein
    the plurality of connection pads comprises first pad portions having a first thickness, and a second pad portion disposed between at least the first pad portions and having a second thickness less than the first thickness.
5. The electronic device of claim 4, wherein
    a portion of the connector where the second pad portion is disposed is soldered to the PCB.
6. The electronic device of claim 2, wherein
    the connector comprises a first joining portion where the connection pad is not disposed and a second joining portion where the connection pad is disposed, and
    the first joining portion is soldered to the PCB.
7. The electronic device of claim 6, further comprising:
    a joining member provided at an outer side of the connector to seal a connecting portion between the shield can and the PCB.
8. The electronic device of claim 7, wherein
    the joining member is applied to the outer side of the connector corresponding to the first joining portion.
9. The electronic device of claim 7, wherein
    the connector is formed in a polygonal shape having vertices, and the joining member is applied to the outer side of the connector corresponding to the vertices.
10. The electronic device of claim 1, wherein
    a sound hole for emitting the sound to an outside is formed in the housing, and
    the frame comprises an acoustic duct for communicating with the sound hole and for allowing the sound to be emitted to the front of the sound module to move through.
11. The electronic device of claim 1, wherein
    the frame comprises a first support portion connected to at least the first board surface, and
    a first sealing member for sealing between the frame and the PCB is disposed on the first support portion.
12. The electronic device of claim 11, wherein
    the first support portion is connected to the PCB to surround a perimeter of the sound module.
13. The electronic device of claim 11, wherein
    the frame comprises a second support portion connected to the sound module, and
    a second sealing member, for sealing between the frame and the sound module, is disposed on the second support portion.
14. The electronic device of claim 1, wherein
    the PCB comprises one or more via holes penetrating through the first board surface and the second board surface, and
    at least one of the one or more via holes is formed at a position overlapping the resonance space.
15. The electronic device of claim 1, wherein
    the shield can comprises one or more vent holes for ventilating the resonance space.
16. An electronic device, comprising:
    a housing comprising a sound hole for communicating with an outside;
    a frame disposed at least partially in the housing and comprising an acoustic duct for communicating with the sound hole;
    a printed circuit board (PCB) disposed at least partially in the housing, the PCB comprising a first board surface facing the frame and a second board surface opposite to the first board surface, and comprising an opening that is open to penetrate through the first board surface and the second board surface;
    a sound module, comprising a speaker, disposed at least partially in the opening so that a front thereof is supported by at least the frame; and a shield can connected to the PCB to at least partially surround a rear of the sound module and form a resonance space positioned in a direction of the second board surface, wherein the resonance space is configured to resonate acoustic vibration emitted to the rear of the sound module.

17. The electronic device of claim 16, wherein the shield can comprises a connector soldered to the second board surface, and a connection pad for sealing between the shield can and the PCB is disposed on the connector.

18. The electronic device of claim 17, wherein the connector comprises a first joining portion where the connection pad is not disposed and a second joining portion where the connection pad is disposed.

19. The electronic device of claim 17, further comprising:

a joining member applied to an outer side of the connector for sealing between the shield can and the PCB.

20. An electronic device, comprising:

a housing;

a printed circuit board (PCB) disposed in the housing, the PCB comprising a first board surface and a second board surface opposite to the first board surface, and comprising an opening that is formed to penetrate through the first board surface and the second board surface;

a sound module, comprising a speaker, disposed at least partially in the opening so that a front thereof is exposed through the first board surface to generate a sound;

a shield can connected to the second board surface to cover the opening and form a hermetic resonance space positioned proximate a rear of the sound module; and a frame disposed to face the first board surface and connected to the sound module to support a front of the sound module, wherein the PCB comprises at least one via hole disposed at a position overlapping the shield can and penetrating through the first board surface and the second board surface.

* * * * *